(12) United States Patent
Kim

(10) Patent No.: US 6,921,717 B2
(45) Date of Patent: Jul. 26, 2005

(54) METHOD FOR FORMING METAL LINES

(75) Inventor: Tae Kyung Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 51 days.

(21) Appl. No.: 10/730,197

(22) Filed: Dec. 5, 2003

(65) Prior Publication Data

US 2004/0266172 A1 Dec. 30, 2004

(30) Foreign Application Priority Data

Jun. 30, 2003 (KR) ................................ 10-2003-0043860

(51) Int. Cl.⁷ ............................................. H01L 21/44
(52) U.S. Cl. ..................... 438/622; 438/641; 438/652
(58) Field of Search ................................ 438/622, 623, 438/625, 641, 652

(56) References Cited

U.S. PATENT DOCUMENTS

| | | | |
|---|---|---|---|
| 4,804,490 A | | 2/1989 | Pryor et al. |
| 4,845,533 A | | 7/1989 | Pryor et al. |
| 6,077,733 A | * | 6/2000 | Chen et al. .................. 438/182 |
| 6,124,681 A | | 9/2000 | Choi |

* cited by examiner

Primary Examiner—Roy Potter
(74) Attorney, Agent, or Firm—Ladas & Parry LLP

(57) ABSTRACT

Disclosed is a method for forming metal lines, which comprises the following steps of: preparing a semiconductor substrate having a lower metal line; successively forming a polymer dielectric film and an oxide film on the substrate, the polymer dielectric film and the oxide film having a contact for exposing a predetermined portion of the lower metal line; dry cleaning a resultant structure according to a remote plasma mechanism to remove the metal oxide film from the surface portion of the lower metal line exposed via the contact and to form a protective film on a lateral portion of the polymer dielectric film; and embedding a metal film functioning as an upper metal line in a contact structure.

5 Claims, 5 Drawing Sheets

METHOD FOR FORMING METAL LINES

BACKGROUND OF THE INVENTION

1. Field of the Invention

The present invention to a method for fabricating semiconductor devices, and more particularly, to a method for forming metal lines, which can form metal lines in a polymer dielectric film without deterioration of buried metal resulting from damage of the polymer dielectric film.

2. Description of the Prior Art

In the high-integrated semiconductor devices, several characteristics, such as a resistance characteristic etc., have been pointed out to be a big problem. Thus, in the process of integrating metal lines having a low dielectric film and a low resistance, a technical development has been studied. Here, for the low dielectric film, a ploymer material having a composition adding oxygen to a compound of carbon and hydrogen is used. For the metal lines, metal material such as tungsten (W), aluminum (Al) or copper (Cu) is used.

FIGS. 1A through 1C are sectional views illustrating a conventional method for forming metal lines.

The conventional method for forming metal lines first prepares a semiconductor substrate 1 with a lower metal line 2 as shown in FIG. 1A. Then, a polymer dielectric film 3 and an oxide film 4 are successively formed on the semiconductor substrate 1. A photosensitive film is coated on the oxide film 4 and exposure and development are performed to the photosensitive film, thereby forming a photosensitive film pattern 9 which partially exposes the lower metal line 2.

Then, as shown in FIG. 1B, the photosensitive film pattern is used as a mask to perform dry etching to the oxide film and the polymer dielectric film, thereby forming a contact h1 which partially expose the lower metal line 2. Then, the photosensitive film pattern is removed.

In dry etching, a metal oxide film 5 is formed on a surface portion of the lower metal line which is exposed via the contact h1. In a subsequent process step, the metal oxide film 5 functions to prevent the lower metal line from being electrically connected with an upper metal line. Therefore, after dry etching, RF sputter etching is performed to remove the metal oxide film. RF sputter etching uses Ar ions which simultaneously etch lateral and upper portions of the contact with kinetic energy.

Then, as shown in FIG. 1C, a wetting Titanium (Ti) film (not shown) and an Aluminum (Al) film (not shown) are successively deposited on an upper face of the contact h1 thereby forming an upper metal line 6 which is electrically connected with the lower metal line 2 as shown in FIG. 1C. The Ti film functions as a ground film.

FIG. 2 is an SEM photograph illustrating a problem in the prior art.

In the prior art, the polymer dielectric film is damaged during RF sputter etching unlike a typical silicon oxide film, thereby increasing the surface coarseness within the contact. Where the upper metal line is formed on the polymer dielectric film, the surface coarseness of the metal film also increases in response to the surface coarseness of the polymer dielectric film.

In particular, when the metal film for the upper metal line is embedded in the contact, it is most important to form a uniform and continuous metal film at an initial stage so as to readily embed a subsequently deposited metal film. However, where the surface coarseness of the metal film is increased as above, the metal film is discontinuously deposited at the initial stage causing a process step of embedding the metal film to be difficult.

SUMMARY OF THE INVENTION

Accordingly, the present invention has been made to solve the above-mentioned problems occurring in the prior art, and an object of the present invention is to provide a method for forming metal lines, in which a polymer dielectric film damaged by a dry etching process is recovered by a plasma assisted dry cleaning process, and thereby during a process of embedding a metal film, the metal film can be continuously deposited and embedded in a stable manner.

In order to accomplish this object, there is provided a method for forming metal lines comprising the following steps of: preparing a semiconductor substrate having a lower metal line; successively forming a polymer dielectric film and an oxide film on the substrate, the polymer dielectric film and the oxide film having a contact for exposing a predetermined portion of the lower metal line; dry cleaning a resultant structure according to a remote plasma mechanism to remove the metal oxide film from the surface portion of the lower metal line exposed via the contact and to form a protective film on a lateral portion of the polymer dielectric film; and embedding a metal film functioning as an upper metal line in a contact structure.

In the dry cleaning step, a cleaning gas makes use of any one of an argon gas and a gas containing fluoro and nitro groups. Preferably, the cleaning gas containing fluoro and nitro groups includes at least one selected from $NF_3/H_2/N_2$, $NF_3/He/O_2$, $NF_3/He$ and a combination thereof.

Further, in the dry cleaning step, plasma is generated by any one of microwave or radio frequency. In the dry cleaning step, a cleaning temperature maintains a temperature range from about 18 to 500° C.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

The following detailed description will present a preferred embodiment of the invention with reference to the accompanying drawings.

Figure 1A:
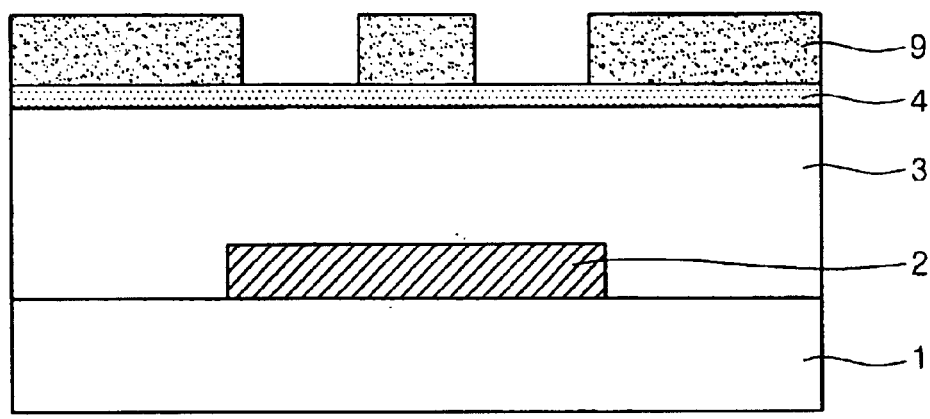
FIGS. 1A through 1C are sectional views illustrating a conventional method for forming metal lines.
Figure 1B:
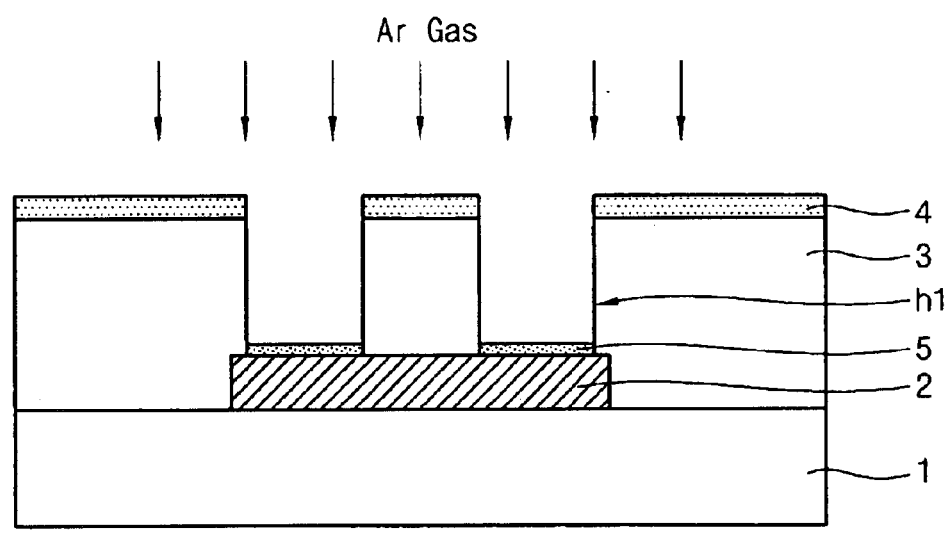
Figure 1C:
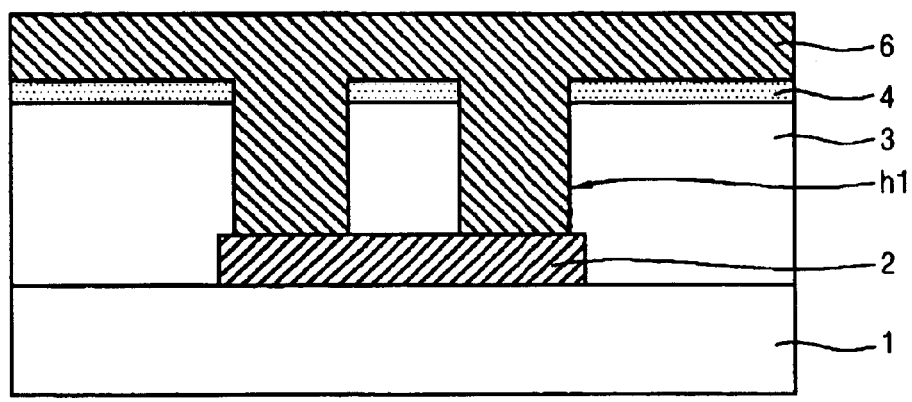
Figure 2:
FIG. 2 is an SEM photograph illustrating a problem in the prior art.
Figure 3A:
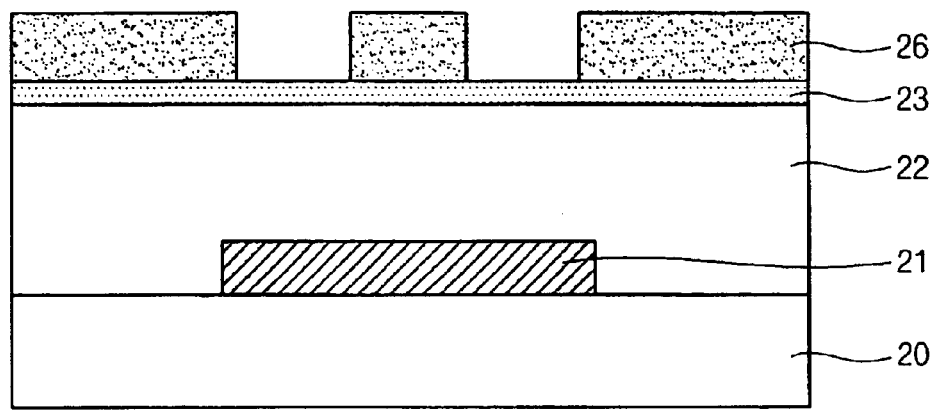
FIGS. 3A through 3C are sectional views illustrating a method for forming metal lines of the invention.
Figure 3B:
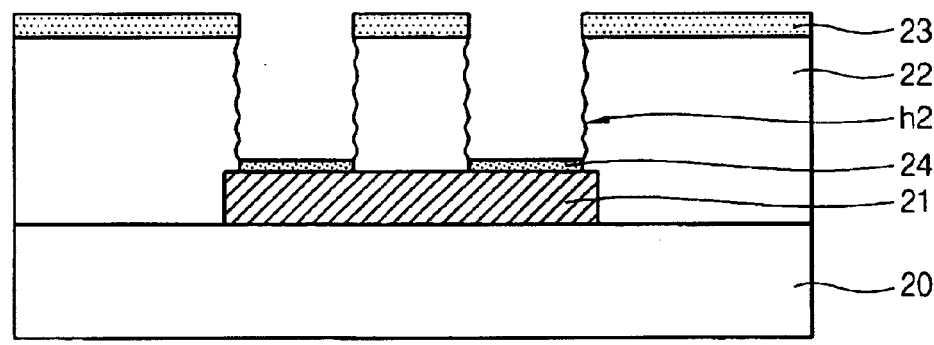
Figure 3C:
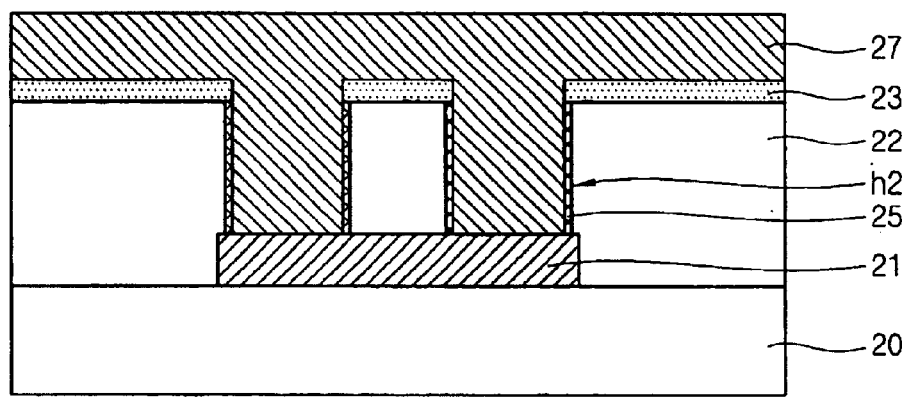

FIGS. 3A through 3C are sectional views illustrating a method for forming metal lines of the invention.

The method for forming metal lines of the invention first prepares a semiconductor substrate 20 having a lower metal line 21 as shown in FIG. 3A. Then, a polymer dielectric film 22 and an oxide film 23 are successively formed on the semiconductor substrate 1. A photosensitive film pattern 26 is formed on the oxide film 23 in order to partially expose the lower metal line 21.

In sequence, as shown in FIG. 3B, the photosensitive film pattern 26 is used as a mask to perform dry etching to the oxide film 23 and the polymer dielectric film 22 thereby forming a contact h2. Then, the photosensitive film pattern is removed.

During dry etching, a metal oxide film 25 is formed on a surface portion of the lower metal line 21 which is exposed via the contact h2. The metal oxide film 25 serves to prevent the lower metal line from being electrically connected with an upper metal line in a subsequent process step. Unlike a typical silicon oxide film, the polymer dielectric film is damaged during sputter etching, thereby increasing the surface coarseness within the contact.

Therefore, after dry etching, a plasma assisted dry cleaning process is performed by aid of a cleaning gas, which consists of any one of an Argon (Ar) gas and a gas containing fluoro and nitro groups. Thus, as shown in FIG. 3c, the metal oxide film is removed, and at the same time a protective film 25 made of SiON is formed on the polymer dielectric film which has an increased surface coarseness. The cleaning gas containing fluoro and nitro groups is preferably selected from at least one of $NF_3/H_2/N_2$, $NF_3/He/O_2$, $NF_3/He$, and a combination thereof.

Plasma is generated through an RF mechanism such as Capacitively Coupled Plasma (CCP) or an Inductively Coupled Plasma (ICP), and source and bias power is adjusted to optimize the efficiency of dry cleaning and plasma processing through Dual Frequency Etch (DFE). Further, the RF mechanism can be replaced with a Wave Heated Plasma (WHP) mechanism which generates plasma with microwaves. Meanwhile, in the plasma assisted dry cleaning process, the fluoro group in the cleaning gas forces the metal oxide film to be removed by reduction reaction.

Figure 4:
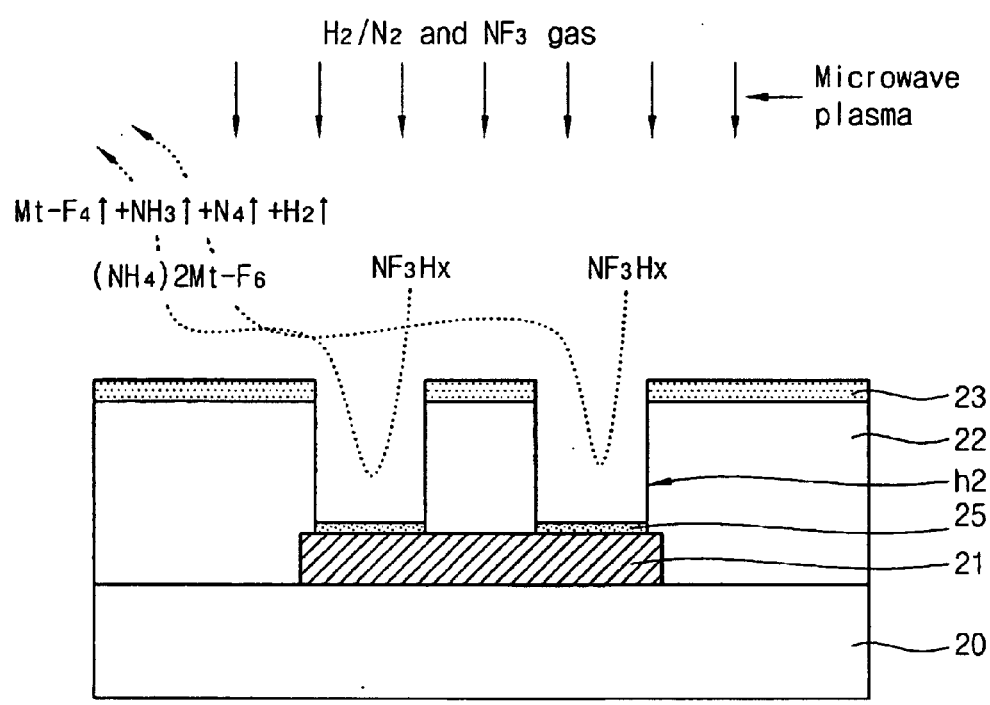
FIG. 4 is a sectional view illustrating a process step of dry cleaning with plasma which is generated according to a WHP mechanism.

FIG. 4 is a sectional view illustrating a process step of dry cleaning with plasma which is generated according to the WHP mechanism.

It will be assumed that $NF_3/H_2/N_2$ is used as cleaning gas.

First of all, as shown in FIG. 4, $N_2/H_2$ reacts with $NF_3$ to form $NF_3Hx$ as expressed in Equation 1 below. Then, $NF_3Hx$ reacts with the metal oxide film $Mt-O_2$ formed on the surface portion of the lower metal line which is exposed via the contact h2 to form reaction byproduct in the form of $(NH_4)\,2Mt-F_6$ as expressed in Equation 2 below. Subsequent heat treatment decomposes reaction byproduct into $Mt-F_4$, $NH_3$, $N_2$ and $H_2$ as expressed in Equation 3 below, thereby removing the metal oxide film from the surface portion of the lower metal line 21:

  Equation 1,

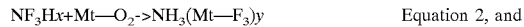  Equation 2, and

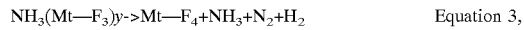  Equation 3, herein Mt means metal, and $Mt-O_2$ means the metal oxide film.

Figure 5:
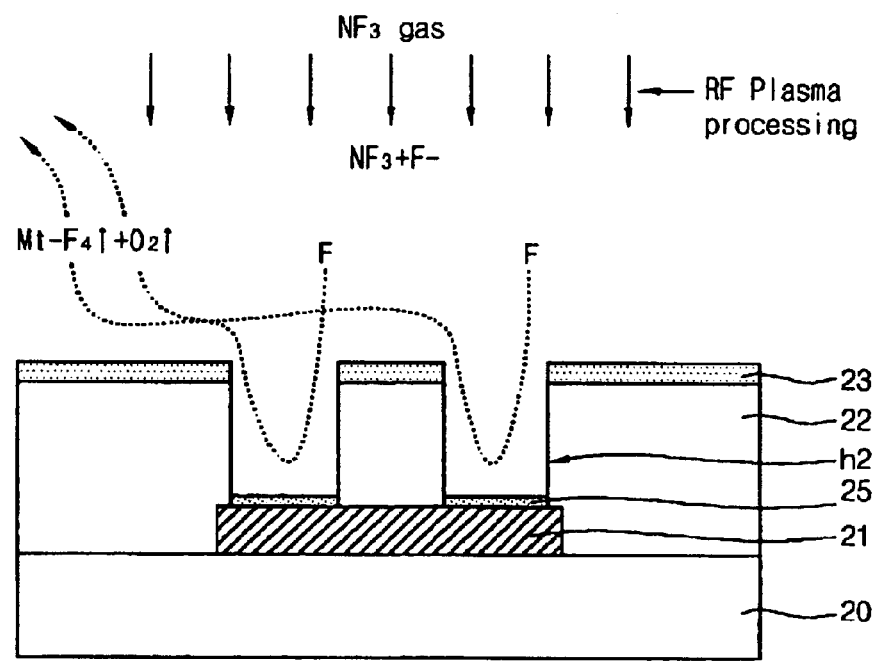
FIG. 5 is a sectional view illustrating a process step of dry cleaning with plasma which is generated according to an RF mechanism.

FIG. 5 is a sectional view illustrating a process step of dry cleaning with plasma which is generated according to the RF mechanism, in which it will be assumed that $NF_3/H_2/N_2$ be used as cleaning gas.

First, $NF_3$ is decomposed into $NF_2$ and F— as expressed in Equation 4 below, and F atoms chemically react with the metal oxide film $Mt-O_2$ to form $Mt-F_4$ and $O_2$ as expressed in Equation 5 below. Then, as expressed in Equation 6 below, $Mt-F_4$ chemically reacts with $O_2$ thereby forming reaction byproduct in the form of $3Mt-O_2$, which is decomposed into $Mt-F_4$, $N_2$ and $O_2$ through heat treatment thereby removing the metal oxide film from the surface portion of the lower metal line (refer to FIG. 5):

  Equation 4,

  Equation 5,

  Equation 6, and

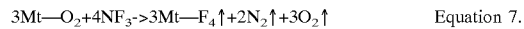  Equation 7.

As shown in FIGS. 4 and 5, the F atoms react with the metal oxide film $Mt-O_2$ to remove the metal oxide film.

In the meantime, the N atoms in cleaning gas react with a C—H compound structure of the polymer dielectric film so that the protective film 25 made of a compact SiON compound having a C—H—N compound structure is formed on the polymer dielectric film.

Then, a metal film such as Ti or Al is deposited on an upper face of the contact h2 thereby forming an upper metal line 25 which is electrically connected with the lower metal line 21.

Figure 6:
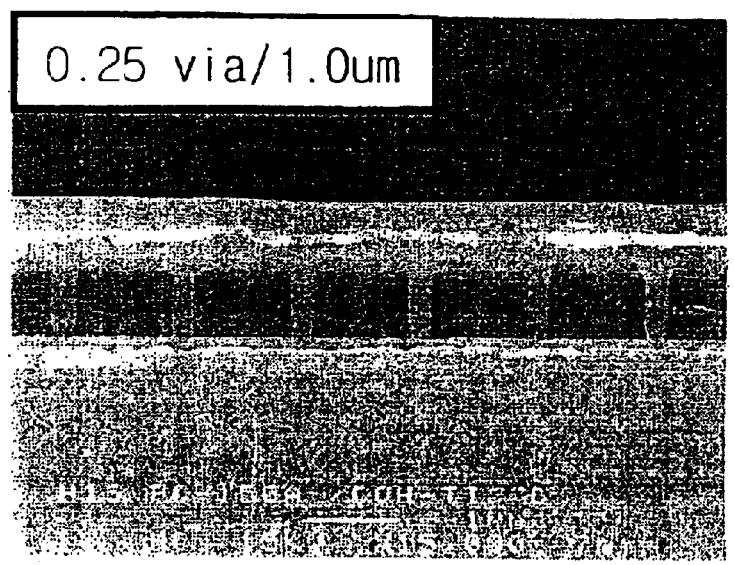
FIG. 6 is an SEM photograph illustrating a resultant structure of the invention.

FIG. 6 is an SEM photograph illustrating a resultant structure of the invention.

When the metal film is embedded after plasma assisted dry cleaning according to the invention, the metal oxide film can be removed from the surface portion of the lower metal line exposed via the contact as well as the protective film can be formed on the lateral portions of the damaged polymer dielectric film. Therefore, in subsequent deposition of the metal film functioning as the upper metal line, the metal film can be successively deposited, ensuring a stable embedding process.

In the meantime, the polymer dielectric film can be replaced with a silicon oxide-based dielectric film.

According to the invention, after etching the contact, dry cleaning with plasma is performed to the polymer dielectric film in inner lateral portions of the contact. Here, as a cleaning gas, either $N_2$ containing a nitro group in $NF_3$ gas or a gas containing the $NF_3$ gas is used. The cleaning gas is subjected to plasma treatment, so that a metal oxide film, which has been formed at the lower metal line exposed by the contact, is removed, and at the same time the protective film with a C—H—N bond is formed on the surface, with a C—H bond, of the polymer dielectric film. Therefore, a subsequently deposited metal film for the upper metal line is uniformly formed without no damage of the polymer dielectric film which is generated during the existing sputtering etching process.

As can be seen from the foregoing, according to the present invention, the plasma assisted dry cleaning process is performed between the contact etching process and the metal film embedding process, so that the metal oxide film of the lower metal lines exposed by the contact is removed, as well as so that the protective film is formed on the side surface of the polymer dielectric film. Thus, the protective film covers the surface of the polymer dielectric film damaged during the etching process, so that it is possible to prevent organic substances, moisture or so forth on the polymer dielectric film from being out-gassed toward the contact, thus improving the characteristic of embedding the metal film in a substrate.

Further, the metal oxide film is removed by a reduction reaction using a fluoro group excited with plasma, so that a direct damage is not caused to the polymer dielectric film on the side wall of the contact, as compared with the existing method in which the metal oxide film has been removed by application of the physical shock caused by a kinetic energy of argon ions. Thus, during the subsequent process of embedding the metal film, the metal film can be continuously deposited and embedded in a stable manner.

Meanwhile, even though the devices have a high aspect ratio or an decreased contact size based on high integration of the devices, it is possible to clean the devices without any change in side profile. Further, there is no substance peeled off by the sputtering, it is possible to solve the problem of particles.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for forming metal lines, comprising the following steps of:

preparing a semiconductor substrate having a lower metal line;

successively forming a polymer dielectric film and an oxide film on the substrate, the polymer dielectric film and the oxide film having a contact for exposing a predetermined portion of the lower metal line;

dry cleaning a resultant structure according to a remote plasma mechanism to remove the metal oxide film from the surface portion of the lower metal line exposed via the contact and to form a protective film on a lateral portion of the polymer dielectric film; and embedding a metal film functioning as an upper metal line in a contact structure.

2. The method for forming metal lines as set forth in claim 1, wherein the dry cleaning step is performed with a cleaning gas using any one of an argon gas and a gas containing fluoro and nitro groups.

3. The method for forming metal lines as set forth in claim 2, wherein the cleaning gas comprises at least one selected from $NF_3/H_2/N_2$, $NF_3/He/O_2$, $NF_3/He$ and a combination thereof.

4. The method for forming metal lines as set forth in claim 1, wherein the dry cleaning step is performed in a temperature range from about 18 to 500° C.

5. The method for forming metal lines as set forth in claim 1, wherein the dry cleaning step generates plasma with microwave or radio frequency.

* * * * *